US008676355B2

(12) United States Patent
Takagi

(10) Patent No.: US 8,676,355 B2
(45) Date of Patent: Mar. 18, 2014

(54) POSITION CONTROL APPARATUS INCLUDING ITERATIVE LEARNING CIRCUIT, EXPOSURE APPARATUS, METHOD FOR MANUFACTURING DEVICE, AND ITERATIVE LEARNING METHOD FOR USE IN POSITION CONTROL APPARATUS HAVING ITERATIVE LEARNING CIRCUIT INCLUDING LEARNING FILTER

(75) Inventor: Kiyoshi Takagi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 570 days.

(21) Appl. No.: 12/393,871

(22) Filed: Feb. 26, 2009

(65) Prior Publication Data

US 2009/0222109 A1 Sep. 3, 2009

(30) Foreign Application Priority Data

Feb. 29, 2008 (JP) ................... 2008-050126

(51) Int. Cl.
*G05D 1/12* (2006.01)
*G05B 13/02* (2006.01)
*G06F 17/00* (2006.01)

(52) U.S. Cl.
USPC ............................. 700/44; 700/105; 700/302

(58) Field of Classification Search
USPC .......................................... 700/44, 105, 302
See application file for complete search history.

(56) References Cited

U.S. PATENT DOCUMENTS

| 6,267,876 B1 * | 7/2001 | Allaire et al. ............... 310/90.5 |
| 7,181,296 B2 * | 2/2007 | Rotariu et al. .................. 700/44 |
| 7,379,156 B2 * | 5/2008 | Kunst et al. .................... 355/53 |
| 2005/0043834 A1 | 2/2005 | Rotariu et al. |
| 2007/0081133 A1 * | 4/2007 | Kayama et al. ................. 355/53 |

FOREIGN PATENT DOCUMENTS

JP 2003-006898 A 1/2003

OTHER PUBLICATIONS

Win, Khin Kyu Kyu and Cheah Chien-Chern, "Mulit-Objective Learning Control for Robotic Manipulator", Journal of Robotic Systems, vol. 21, issue 10, 2004, pp. 539-557.*
Win, Khin Kyu Kyu and Cheah Chien-Chern, "Multi-Objective Learning Control for Robotic Manipulator", Journal of Robotic Systems, vol. 21, issue 10, 2004, pp. 539-557.*
Bristow, Tharayil, Alleyne, "A Survey of Iterative Learning Control", IEEE Control Systems Magazine, IEEE. vol. 26, issue 3, Jun. 2006, pp. 96-114.*
Steinbuch, Molengraph, "Iterative Learning Control of Industrial Motion Systems", Proc. 1st IFAC conference on Mechatronic Systems, Darmstadt (2000), pp. 1-6.*

(Continued)

*Primary Examiner* — Kakali Chaki
*Assistant Examiner* — Walter Hanchak
(74) *Attorney, Agent, or Firm* — Canon U.S.A., Inc., IP Division

(57) ABSTRACT

A position control apparatus includes a detecting unit configured to detect a position of a control target, a subtracting unit configured to subtract an output of the detecting unit from a target value, an iterative learning control circuit including a filter into which a deviation between the output of the detecting unit and the target value is input, where the iterative learning control circuit feeds forward a control input to the control target, and a parameter computing unit configured to compute a variation in a parameter of the control target. A characteristic of the filter is changed in accordance with the variation in the parameter of the control target.

10 Claims, 12 Drawing Sheets

(56) References Cited

OTHER PUBLICATIONS de Roover, "Synthesis of a Robust Iteratie Learning Controller Using an H-infinity Approach", Proceedings fo the 35th Conference on Decision and Control, Kobe, Japan, Dec. 1996, pp. 3044-3049.*

Kevin L. Moore, Mohammed Dahleh, and S. P. Bhattacharyya, "Iterative Learning Control: A Survey and New Results", Journal of Robotic Systems, (1992), pp. 563-594, vol. 9(5), John Wiley & Sons, Inc.

Rotariu et al: "Time-frequency analysis of a motion system with learning control" Proceedings of the 2003 American Control Conference. Acc. Denver, CO, Jun. 4-6, 2003; [American Control Conference], New York, NY: IEEE, US, vol. 4, Jun. 4, 2003, pp. 3650-3654, XP10667057.

Synthesis of robust multivariable iterative learning controllers with application to a wafer stage motionsystem, Dick De Roover and Okko H.Bosgra, Int.J.Control, 2000,vol. 73, No. 10, 968-979.

* cited by examiner

POSITION CONTROL APPARATUS INCLUDING ITERATIVE LEARNING CIRCUIT, EXPOSURE APPARATUS, METHOD FOR MANUFACTURING DEVICE, AND ITERATIVE LEARNING METHOD FOR USE IN POSITION CONTROL APPARATUS HAVING ITERATIVE LEARNING CIRCUIT INCLUDING LEARNING FILTER

BACKGROUND OF THE INVENTION

1. Field of the Invention

The present invention relates to a position control apparatus including an iterative learning control circuit suitably applied to a stage unit used in exposure apparatuses or machine tools.

2. Description of the Related Art

Iterative learning control is control in which, by repeatedly performing control (a trial) for tracking the trajectory of a target to be controlled, a deviation from the target trajectory is reduced so that high-precision control can be provided. In general, in the iterative learning control, learning can be performed by using only an input applied to a target to be controlled and an output of the target. Accordingly, non-linearity that is difficult to include in a control model and a quantization error can be compensated for. It is required for a target to be controlled to have reproducibility so that the same output is obtained from the same input. In general, scanning semiconductor exposure apparatuses and industrial robots meet this condition. Accordingly, in order to further improve the control precision, the iterative learning control can be applied to these semiconductor exposure apparatuses and industrial robots. Several applications have been proposed.

In the iterative learning control, the term "learning rule" is referred to as an algorithm in which an output is obtained through a given trial and the next input is updated in accordance with the output. One of typical learning rules is a rule in which an input value is generated by multiplying the second derivative value of a deviation by a constant matrix. In addition, by using a PD compensator for a learning rule, iterative learning control can be performed without using a control target model.

Furthermore, De Roover and his colleagues obtain such a learning filter by using an H∞ control theory (Synthesis of robust multivariable iterative learning controllers with application to a wafer stage motion system, click DE ROOVER and OKKO H. BOSGRA, International Journal of Control, 2000, Vol. 73, No. 10, pp. 968-979).

Still furthermore, U.S. Pat. No. 7,181,296 B2 describes a method in which, in addition to the above-described model-based learning rule, time-frequency analysis is used so that a robustness filter is time-varied. This method reduces an effect of noise on learning, and therefore, the learning is efficiently carried out.

In iterative learning control, an optimal input is obtained by repeatedly carrying out trials. Accordingly, it takes a certain amount of time until an input for precisely tracking the target trajectory is obtained. For example, for semiconductor exposure apparatuses, the processing time (the throughput) is an important factor for their performance. Therefore, it is desirable that the amount of time required for the learning is minimized.

In order to reduce the number of trials and obtain an optimal input, information about the target to be controlled can be actively used. However, in the above-described document, the learning filter is derived from a linear time-invariant model, and therefore, the learning filter is linear time-invariant (LTI).

Accordingly, if the parameters of a model are varied during a trial, the consistency between the model and the learning filter is not ensured. As a result, the learning performance is degraded, and therefore, the number of iterative trials and learning time increase.

SUMMARY OF THE INVENTION

According to an aspect of the present invention, a position control apparatus includes an iterative learning control circuit that reduces the number of iterative trials and the time required for the iterative learning.

According to another aspect of the present invention, a position control apparatus includes a detecting unit configured to detect a position of a control target, a subtracting unit configured to subtract an output of the detecting unit from a target value, an iterative learning control circuit including a filter into which a deviation between the output of the detecting unit and the target value is input, where the iterative learning control circuit feeds forward a control input to the control target, and a parameter computing unit configured to compute a variation in a parameter of the control target. A characteristic of the filter is changed in accordance with the variation in the parameter of the control target.

According to another aspect of the present invention, a position control apparatus includes a detecting unit configured to detect a position of a control target, a deviation computing unit configured to compute a deviation between an output of the detecting unit and a target value, a feedback controller configured to generate a feedback signal to be input to the control target using the deviation, an iterative learning control circuit configured to generate a feedforward signal to be input to the control target, where the iterative learning control circuit includes a filter that generates a control signal using the deviation obtained in a kth trial ($k \geq 1$), the iterative learning control circuit generating the feedforward signal for a (k+1)th trial using a control signal generated by the filter using the deviation computed in the kth trial and the feedforward signal generated for the kth trial, a parameter computing unit configured to compute a variation in a parameter of the control target, a changing unit configured to change a characteristic of the first filter in accordance with the variation in the parameter of the control target, and an adding unit configured to sum the feedback signal generated in the (k+1)th trial and the feedforward signal generated for the (k+1)th trial.

According to another aspect of the present invention, a position control apparatus includes a detecting unit configured to detect a position of a control target, a filter configured to generate a control input using a deviation between an output of the detecting unit and a target value, an iterative learning control circuit configured to feed forward the control input to the control target, a parameter computing unit configured to compute a variation in a parameter of the control target, and a changing unit configured to change a characteristic of the filter in accordance with the variation in the parameter of the control target.

According to another aspect of the present invention, an iterative learning method for use in a position control apparatus having an iterative learning control circuit including a learning filter is provided. The method includes applying an iterative learning input obtained in a kth trial to a control target, computing the learning filter by acquiring a variation parameter of the control target, and computing the iterative learning input for a (k+1)th trial using a control input generated by the learning filter using a deviation between a position of the control target in a kth trial and a target value and an iterative learning input computed for the kth trial.

According to another aspect of the present invention, an exposure apparatus is configured to project a pattern of an original onto a substrate and expose the substrate to light. The exposure apparatus includes a stage having one of the original and the substrate mounted thereon, the stage positioning the one of the original and the substrate, the stage including a position control apparatus, the position control apparatus including a detecting unit configured to detect a position of a control target, a subtracting unit configured to subtract an output of the detecting unit from a target value, an iterative learning control circuit including a filter into which a deviation between the output of the detecting unit and the target value is input, wherein the iterative learning control circuit feeds forward a control input to the control target, and a parameter computing unit configured to compute a variation in a parameter of the control target, wherein a characteristic of the filter is changed in accordance with the variation in the parameter of the control target.

According to another aspect of the present invention, a method for manufacturing a device includes exposing a substrate to light through a pattern of an original using an exposure apparatus, and developing the exposed substrate, wherein the exposure apparatus includes a stage having one of the original and the substrate mounted thereon, the stage positioning the one of the original and the substrate, and wherein the stage includes a position control apparatus, and wherein the position control apparatus includes a detecting unit configured to detect a position of a control target, a subtracting unit configured to subtract an output of the detecting unit from a target value, an iterative learning control circuit including a filter into which a deviation between the output of the detecting unit and the target value is input, wherein the iterative learning control circuit feeds forward a control input to the control target, and a parameter computing unit configured to compute a variation in a parameter of the control target, and wherein a characteristic of the filter is changed in accordance with the variation in the parameter of the control target.

Further features of the present invention will become apparent from the following description of exemplary embodiments with reference to the attached drawings.

DESCRIPTION OF THE EMBODIMENTS

Figure 1:
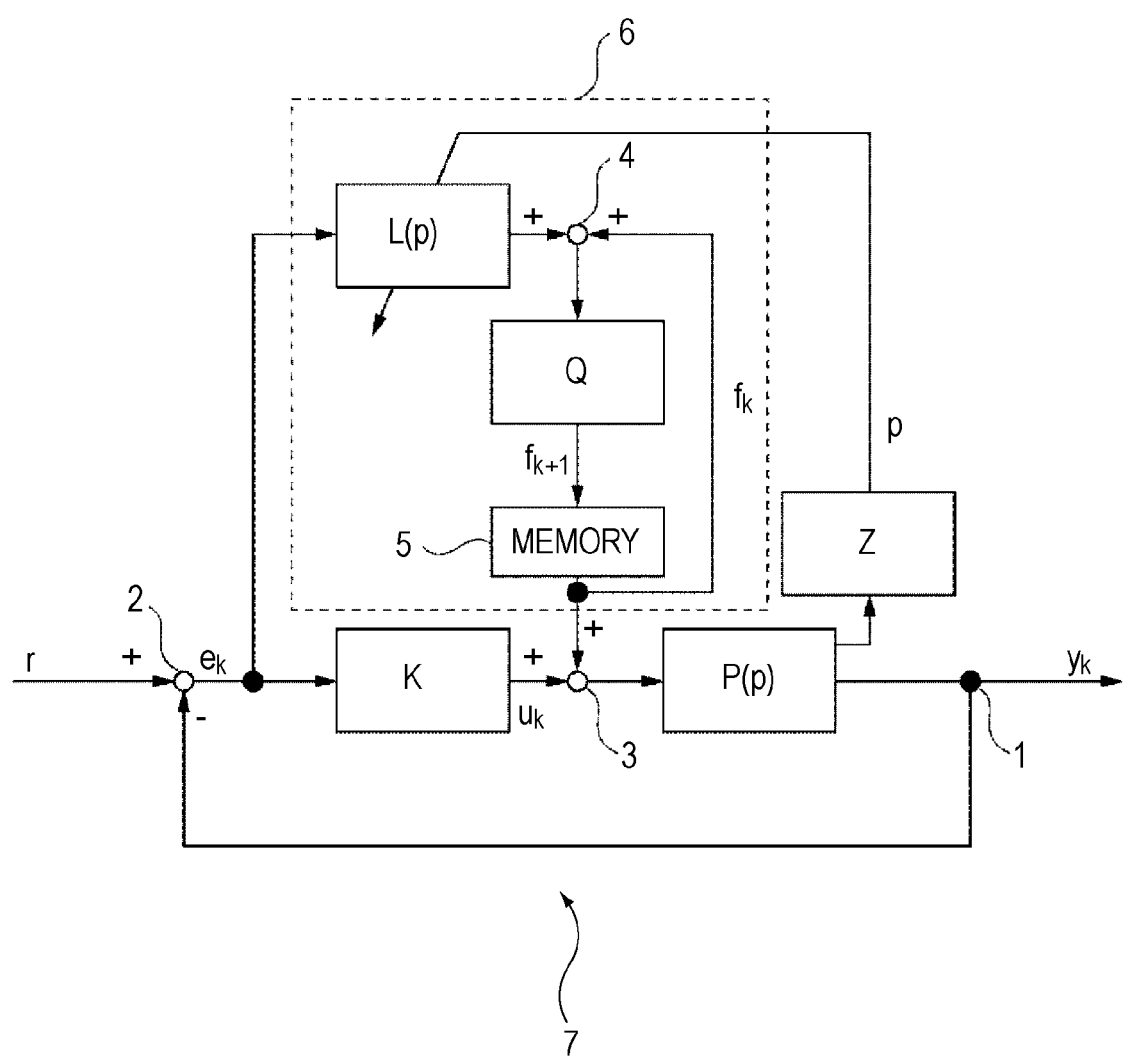
FIG. 1 is a control block diagram of a position control circuit using linear parameter varying (LPV) iterative learning control.

FIG. 1 is a control block diagram of an exemplary position control apparatus according to a first embodiment of the present invention. A position control apparatus 7 controls the position of a control target P(p). The position control apparatus 7 includes a feedback controller K, a detecting unit 1 for detecting a position $y_k$ of the control target P(p), and a subtracting unit 2 for subtracting the output of the detecting unit 1 from a target value r. The position control apparatus 7 further includes an iterative learning control circuit 6 for providing the control target P(p) with a control input obtained through iterative learning.

The iterative learning control is aimed to reduce a deviation from a target trajectory by repeatedly performing tracking of the target trajectory. Hereinafter, k represents the iteration trial number.

The iterative learning control circuit 6 includes a learning filter L(p) (a first filter) for generating a control input, a robustness filter Q (a second filter) for blocking a frequency range unnecessary for the learning operation of the learning filter L(p), and a memory 5 for storing the generated control input.

A deviation $e_k$ (a k-th deviation) of the output of the detecting unit 1 from the target value r is input to the learning filter L(p). The output of the learning filter L(p) is input to an adding unit 4. In addition, a k-th control input $f_k$ is input to the adding unit 4. The output of the adding unit 4 is input to the robustness filter Q. The output of the robustness filter Q is input to the memory 5 as a (k+1)th control input $f_{k+1}$. The control input $f_{k+1}$ stored in the memory 5 is added to the control target in the form of a feedforward input in a (k+1)th tracking control operation. That is, the control input $f_{k+1}$ is added to an output $u_{k+1}$ of the feedback controller K by an adding unit 3.

According to the first embodiment of the present invention, the position control apparatus includes a parameter variation computing unit Z for detecting or estimating a variation in a parameter p of the control target P(p). The characteristics of the learning filter L(p) is computed in accordance with the variation in the parameter p.

In order to detect or estimate a variation in the parameter p, for example, information regarding a correlation between the physical quantity of the control target and a variation in the parameter p can be prestored in a memory (not shown) in the form of, for example, a table or a function. During the tracking control, a variation in the parameter p can be obtained after detecting the physical quantity using, for example, a sensor.

A method for deriving the learning filter L(p) is described next.

In order to derive the learning filter L(p), the control target P(p) is expressed as a linear parameter varying (LPV) model including a variation in the parameter.

In general, an LPV system is a plant in which the state space matrix is a function of a parameter p. The LPV system is expressed as follows:

$$\dot{x} = A(p)x + B(p)u, \quad (1)$$

$$y = C(p)r + D(p)u \quad (2)$$

Here, in the feedback control system shown in FIG. 1, a closed loop system $P_{cl}(p)$ of the control target P(p) and the feedback controller K is expressed as follows:

$$P_{cl}(p) := \frac{-P(p)}{I + P(p)K} \quad (3)$$

where the feedback controller K is a fixed feedback controller that does not vary in accordance with a variation in the parameter.

According to the present embodiment, the learning filter L(p) is an LPV system and is expressed as follows:

$$\dot{x} = A_L(p)x_L + B_L(p)e, \quad (4)$$

$$y_L = C_L(p)x_L + D_L(p)e \quad (5)$$

In addition, for the iterative learning control circuit shown in FIG. 1, the control input is defined as follows:

$$f_{k+1} = Q(f_k + L(p)e_k) \quad (6)$$

Using the above-described equations, the relationship between deviations $e_{k+1}$ and $e_k$ is expressed as follows:

$$\begin{aligned} e_{k+1} &= P_{cl}(p)f_{k+1} \\ &= P_{cl}(p)Q(f_k + L(p)e_k) \\ &= P_{cl}(p)Q(P_{cl}(p)^{-1}e_k + L(p)e_k) \\ &= Q(I + P_{cl}(p)L(p))e_k \end{aligned} \quad (7)$$

In order to converge the deviation through iterative learning, the following condition is satisfied:

$$\|Q(I + P_{cl}(p)L(p))\|_\infty < 1 \quad (8)$$

Figure 3:
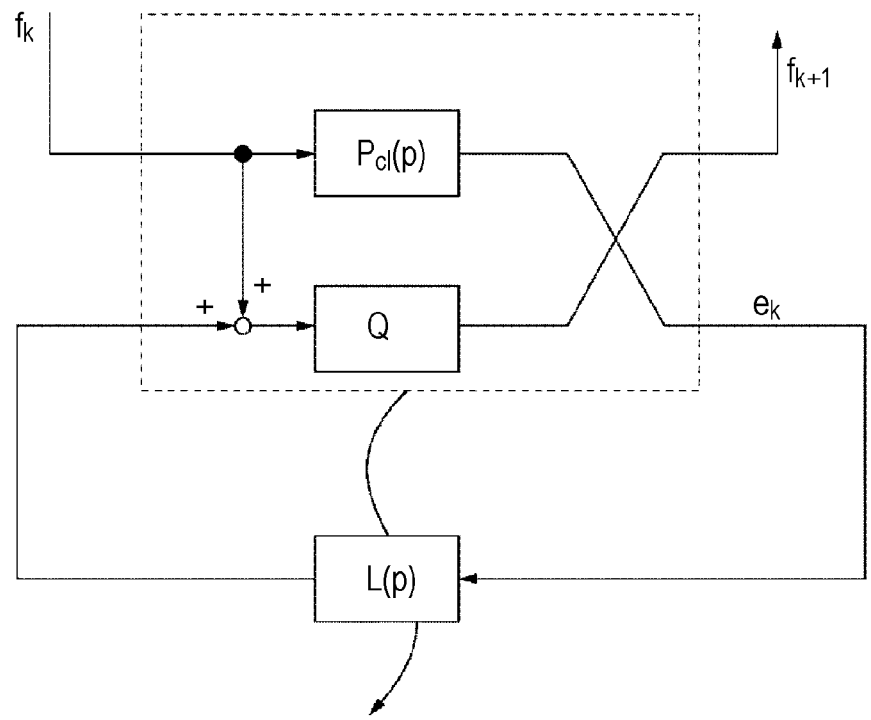
FIG. 3 is a block diagram of an equivalently converted gain-scheduled H∞ control problem used when an LPV learning filter is derived.

The learning filter L(p) is derived so that condition (8) is satisfied. The above-described problem can be illustrated using a control block diagram shown in FIG. 3 (an equivalent conversion diagram of the diagram shown in FIG. 1). As shown in FIG. 3, let $P_h(p)$ denote a portion surrounded by a dotted line. Then, the problem is expressed as a gain-scheduled H∞ control problem in which L(p) is varied in accordance with a variation in $P_h(P)$. Accordingly, by using a linear matrix inequality, linear time-invariant learning filters $L_i$ corresponding to i vertices of the varying parameter can be obtained. Hereinafter, the linear matrix inequality is denoted as "LMI", and the linear time-invariant learning filter is denoted as an "LTI learning filter".

The LTI learning filter $L_i$ is expressed as the following matrix:

$$L_i := \begin{pmatrix} A_{Li} & B_{Li} \\ C_{Li} & D_{Li} \end{pmatrix} \quad (9)$$

For example, when the number of parameters that vary is one, the number of vertices of the parameter is two. Accordingly, two LTI learning filters $L_1$ and $L_2$ (invariant filters) corresponding to the two vertices can be obtained.

Here, by interpolating values between the two LTI learning filters using the following interpolation expression, the learning filter L(p) can be computed in accordance with a variation in the parameter p:

$$L(p) = \frac{(p_{max} - p)}{(p_{max} - p_{min})} L_1 + \frac{(p - p_{min})}{(p_{max} - p_{min})} L_2 \quad (10)$$

where $P_{min}$ represents the lower limit value, and $P_{max}$ represents the upper limit value.

That is, the learning filter L(p) includes an interpolation computing unit.

Figure 4:
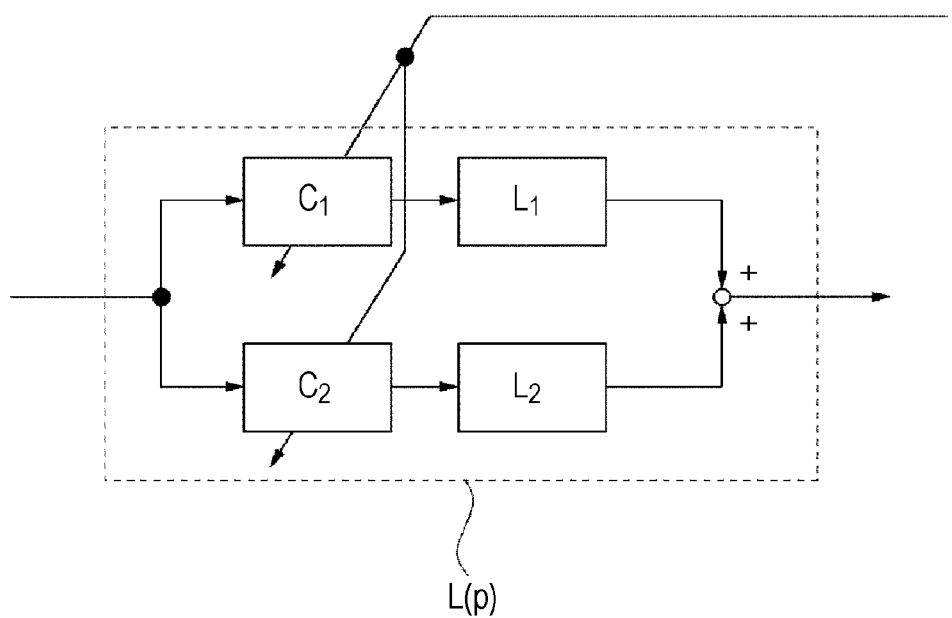
FIG. 4 is a block diagram illustrating a learning filter L(p).

FIG. 4 is a control block diagram expressed by equation (10). In FIG. 4, a constant value $C_1$ represents a coefficient of L1, and a constant value $C_2$ represents a coefficient of L2. By adding the product of the constant value $C_1$ and a learning filter L1 to the product of the constant value $C_2$ and a learning filter L2, the LPV learning filter L(p) can be obtained.

The flow of iterative learning control performed by the position control apparatus shown in FIG. 1 is described below.

Figure 2:
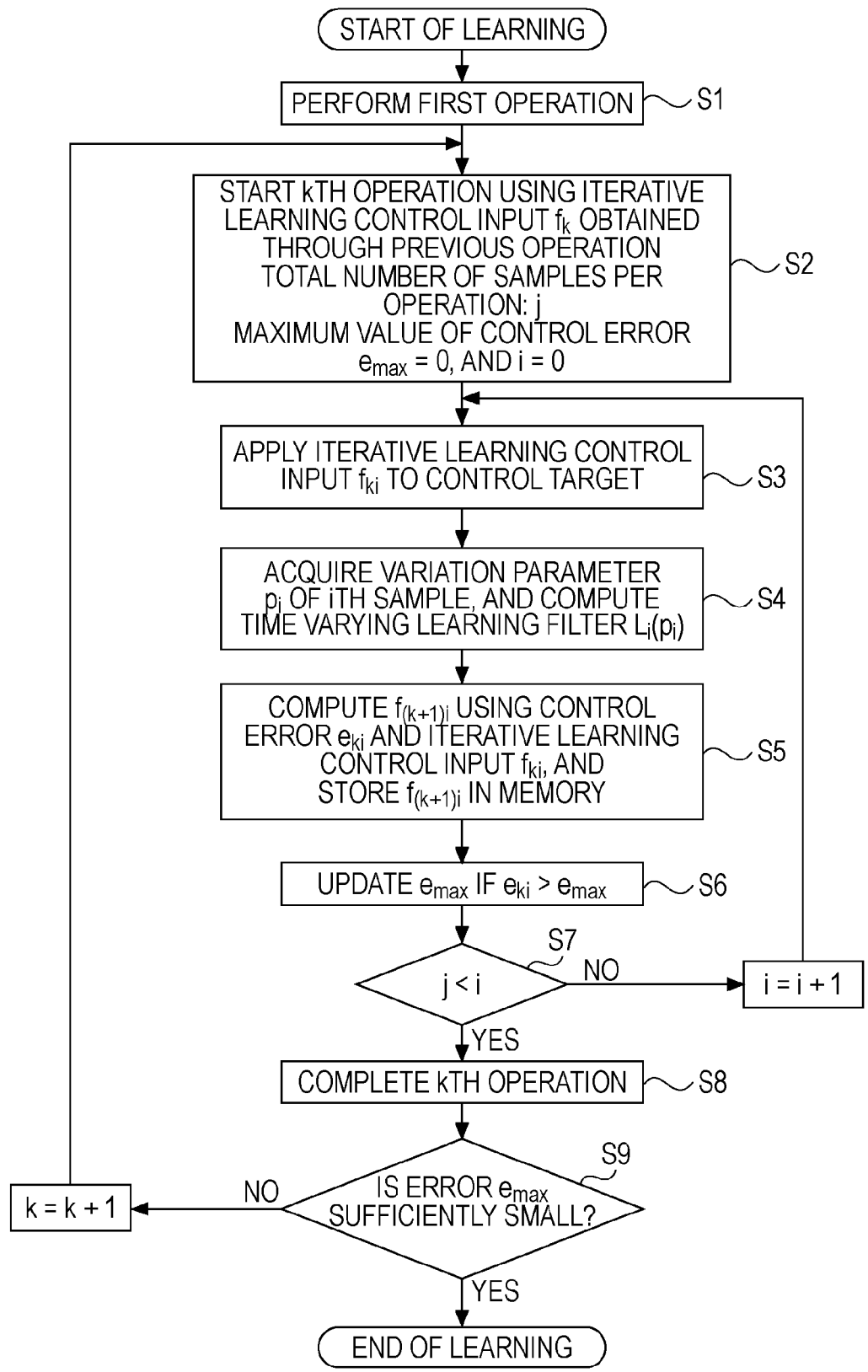
FIG. 2 is a flowchart of position control using the LPV iterative learning control.

FIG. 2 is a flowchart of the iterative learning control.

In step S1, a first trial is carried out. In step S1, control is performed without using the input from the iterative learning control circuit. A deviation $e_1$ is input to the learning filter L(p). The output from the learning filter L(p) passes through the robustness filter Q and is stored in the memory 5 as an input $f_2$.

In step S2, a k-th trial (k>1) is carried out. Note that, since digital control is carried out, a control input and a deviation of an i-th sample in the k-th trial are denoted as $f_{ki}$ and $e_{ki}$, respectively. Let j denote the total number of samples in one trial. Initially, a maximum value $e_{max}$ of the deviation is set to 0, and a sample number i is set to 0.

In step S3, a control input $f_k$ previously stored in the memory 5 is added to an output $U_k$ output from the controller. In this way, the control target is controlled in the k-th trial.

In addition, in the k-th trial, a (k+1)th control input is generated through the processing performed in the following steps S4 and S5.

In step S4, the parameter variation computing unit Z detects or estimates a parameter $p_i$ of an i-th sample. Using the result of the detection or estimation, the learning filter $L_i(p_i)$ is computed. In order to compute the learning filter $L_i(p_i)$, the above-described equation (10) is used, for example. In this way, the learning filter $L_i(p_i)$ can be computed.

In step S5, the deviation $e_{ki}$ is input to the learning filter $L_i(p_i)$. The output of the learning filter $L_i(p_i)$ is added to the control input $f_{ki}$. Thereafter, the result passes through the robustness filter Q and is stored in the memory 5 as a control input $f_{(k+1)i}$.

In step S6, the deviation $e_{ki}$ is compared with the maximum value $e_{max}$ of the deviation. If the deviation $e_{ki} > e_{max}$, then $e_{max}$ is updated.

If, in step S7, j<i (YES in step S7), then the processing proceeds to step S8. However, if j≥i (NO in step S7), i=i+1 and, subsequently, the processing proceeds to step S2.

In step S8, the k-th trial is completed.

In step S9, the maximum value $e_{max}$ of the deviation is compared with a predetermined setting value. If the maximum value $e_{max}$ is smaller than or equal to the predetermined setting value (YES in step S9), it is determined that the deviation is sufficiently small. Therefore, the learning operation is completed. However, if the maximum value $e_{max}$ is greater than the predetermined setting value (NO in step S9), k=k+1 and, subsequently, the processing proceeds to step S2.

By controlling the position using the above-described iterative learning control scheme, the number of trials required for reducing the deviation to a value less than the predetermined value can be reduced, as compared with existing iterative learning control schemes that do not vary the learning filter. As a result, an amount of time required for iterative learning can be decreased.

Exemplary suitable parameters and the resultant effective data are described with reference to the following first to third embodiments of the present invention.

In the first embodiment, the parameters include the force coefficient of a drive unit that drives a control target.

A position control apparatus according to the present embodiment is described next with reference to FIG. 1. Note that descriptions already made with reference to FIG. 1 are not repeated. The parameter variation computing unit Z computes a variation in the parameter. More specifically, the parameter variation computing unit Z prestores information indicating the correlation between the position of the control target and the force coefficient in a memory (not shown) and computes a variation in the force coefficient using that information and the position of the control target P detected by the detecting unit (sensor) 1. As described below, the parameter can be expressed using an expression including the force coefficient. Accordingly, a variation in the parameter can be computed from the variation in the force coefficient.

Figure 5:
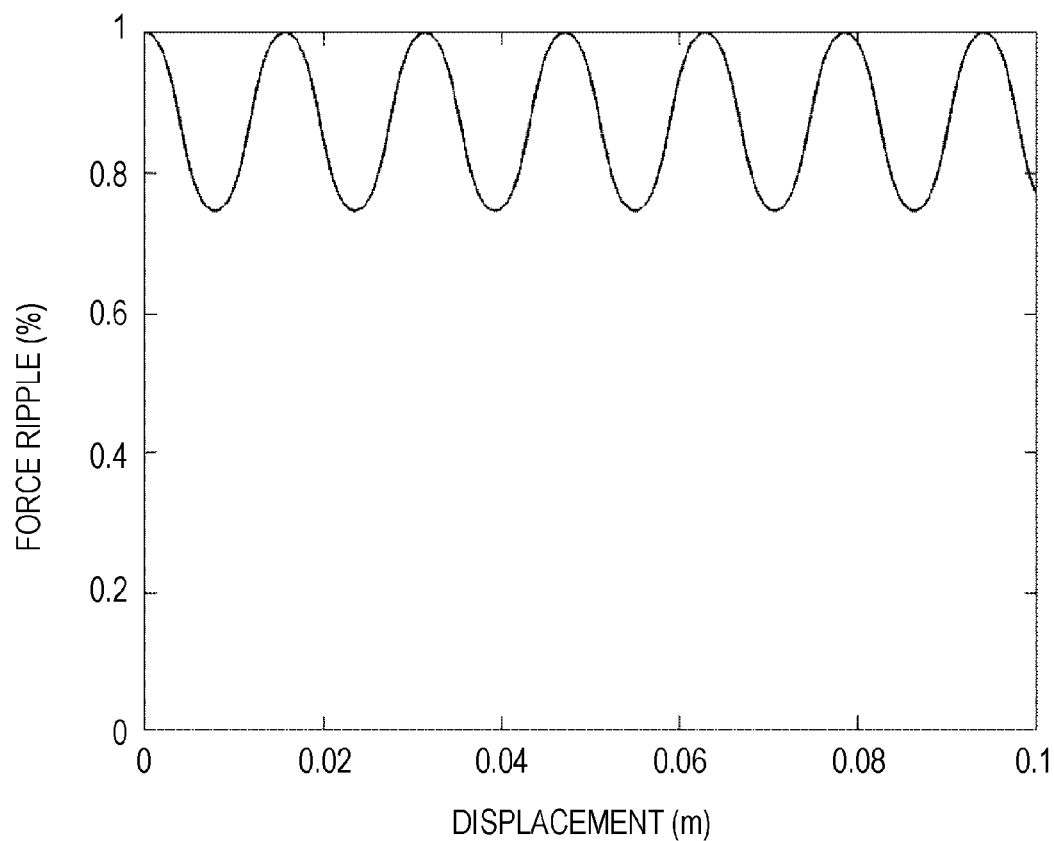
FIG. 5 is a graph illustrating a relationship between the position of a control target and the force ripple.

For example, the information indicating the correlation between the position of the control target and the force coefficient can be obtained by detecting the force ripple, as shown in FIG. 5, while moving the control target and computing the force coefficient from the detected force ripple.

A method for deriving an LPV model when the parameter p includes the force coefficient and a method for deriving a learning filter L(p) are described next.

Let m denote the mass of the control target, x denote a displacement, $u_u$ denote a force input to the control target, and a denote the force coefficient of the drive unit that drives the control target. Then, the control target is modeled as follows:

$$m\ddot{x} = au_u \quad (11)$$

A procedure for transforming this model into an affine parameter-dependent model, which is one of LPV models, is described next.

First, the state vector is defined as:

$$x = [x\ \dot{x}]^T \quad (12)$$

Subsequently, the state equation is obtained using equation (11) as follows:

$$\dot{x} = \begin{bmatrix} 0 & 1 \\ 0 & 0 \end{bmatrix} x + \begin{bmatrix} 0 \\ \frac{a}{m} \end{bmatrix} u_u \quad (13)$$

When setting:

$$p = \frac{a}{m} \text{ then,} \quad (14)$$

$$\dot{x} = \begin{bmatrix} 0 & 1 \\ 0 & 0 \end{bmatrix} x + p \begin{bmatrix} 0 \\ 1 \end{bmatrix} u_u = Ax + pB_0 u_u \quad (15)$$

Here, an output equation y is defined as follows:

$$y = [1\ 0] x = Cx \quad (16)$$

In addition, the amplifying characteristics of an actuator are expressed using the following state equation and output equation:

$$\dot{x}_f = A_f x_f + B_f u \quad (17)$$

$$u_u = C_f x_f \quad (18)$$

Here, the following augmented plant of equations (15) and (16) can be obtained using $x_w = [x\ x_f]^T$:

$$\dot{x}_x = \begin{bmatrix} A & pB_0 C_f \\ 0 & A_f \end{bmatrix} x_w + \begin{bmatrix} 0 \\ B_f \end{bmatrix} u = A_w x_w + B_w u \quad (19)$$

$$y = [C\ 0] x_w = C_w x_w \quad (20)$$

Then, the system matrix can be written as:

$$A_w = \begin{bmatrix} A & pB_0 C_f \\ 0 & A_f \end{bmatrix} = \begin{bmatrix} A & 0 \\ 0 & A_f \end{bmatrix} + p \begin{bmatrix} 0 & B_0 C_f \\ 0 & 0 \end{bmatrix} = A_0 + pA_1 \quad (21)$$

In this way, the system matrix can be expressed using the matrix $A_0$ that does not include the parameter p and the matrix $A_1$ that has only coefficients of the parameter p. Thus, equation (21) serves as the following affine parameter-dependent model:

$$\dot{x}_w = \overset{A_w(p)}{\overline{(A_0 + pA_1)}} x_w + B_w u \quad (22)$$

Figure 6:
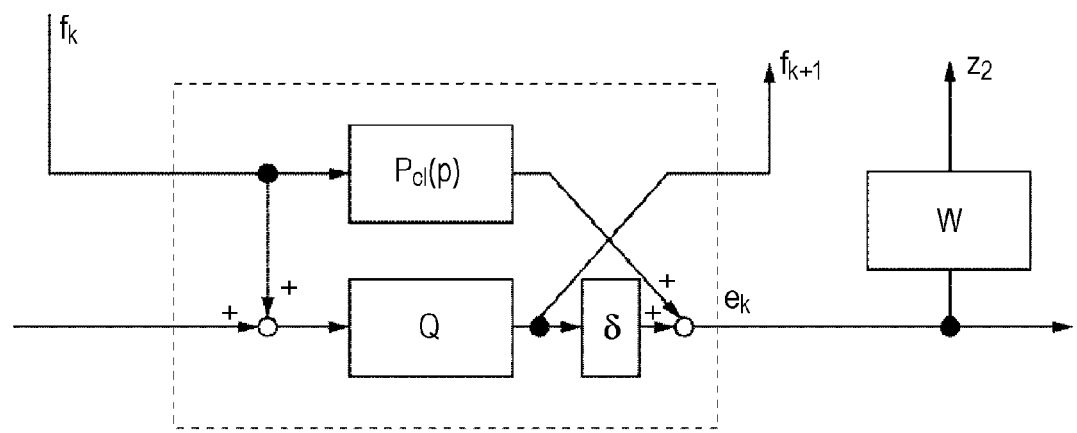
FIG. 6 is a block diagram illustrating a generalized plant including a closed-loop system manipulating a variation in a control target, a robustness filter, and a weight function.

A generalized plant obtained by introducing a weight function W, a constant δ, and a control value $Z_2$ into a control system including a closed loop system $P_{cl}(P)$ using the model of equation (22) and a feedback controller and the robustness filter Q can be illustrated as shown in FIG. 6. Accordingly, an LTI learning filter Li corresponding to each of i vertices of a parameter varying on the basis of the gain-scheduled $H_\infty$ control theory based on the LMI can be derived. Note that, in this embodiment, the robustness filter Q is a first-order low-pass filter having a cut-off frequency of 350 Hz.

In addition, the weight function W is defined as:

$$W(s) = \frac{10^9}{s + 0,0001} \quad (23)$$

Furthermore, the constant δ is a significantly small constant value.

If the range of a variation in the force coefficient a is set to:

$$0.75 \leq a \leq 1, \quad (24)$$

then the parameter p varies in the following range:

$$\frac{0.75}{m} = p_{min} \leq p \leq p_{max} = \frac{1}{m} \quad (25)$$

Figure 7:
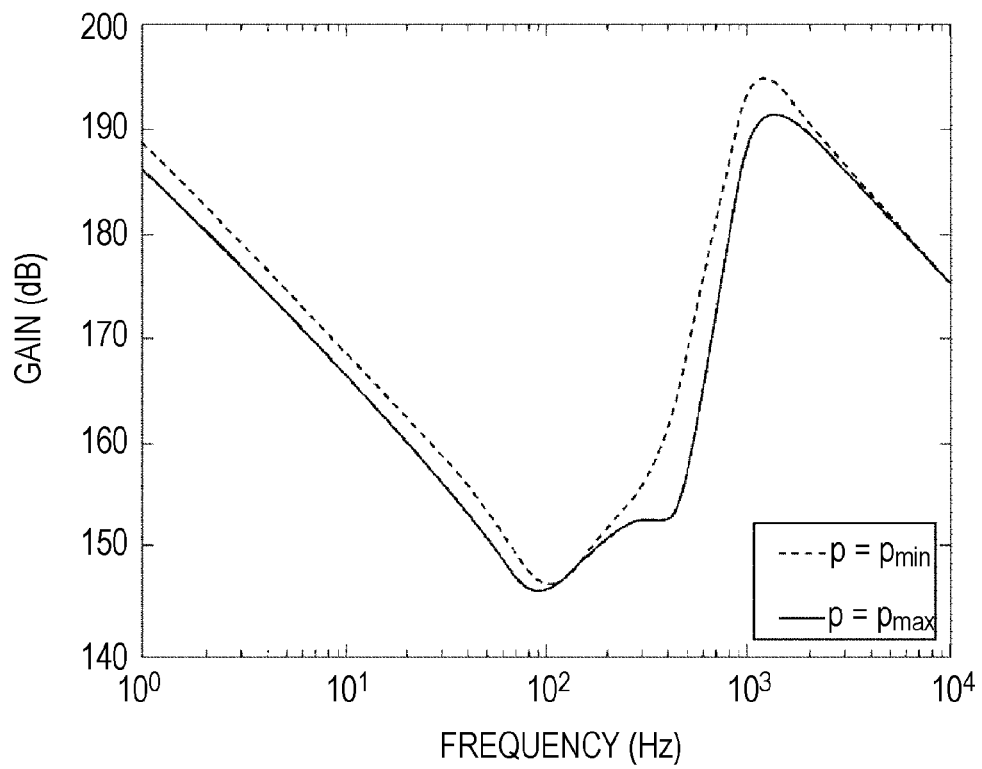
FIG. 7 is a gain diagram illustrating an LPV iterative learning filter.

The derived LPV learning filter is illustrated in FIG. 7. The solid line and the dotted line represent the learning filters when the parameter p is the upper limit value $P_{max}$ and when the parameter p is the lower limit value $P_{min}$, respectively. Let $L_1$ and $L_2$ denote the learning filters. Then, an LPV learning filter adaptive to the variation in the parameter p caused by force ripple can be obtained by using equation (10).

Figure 9:
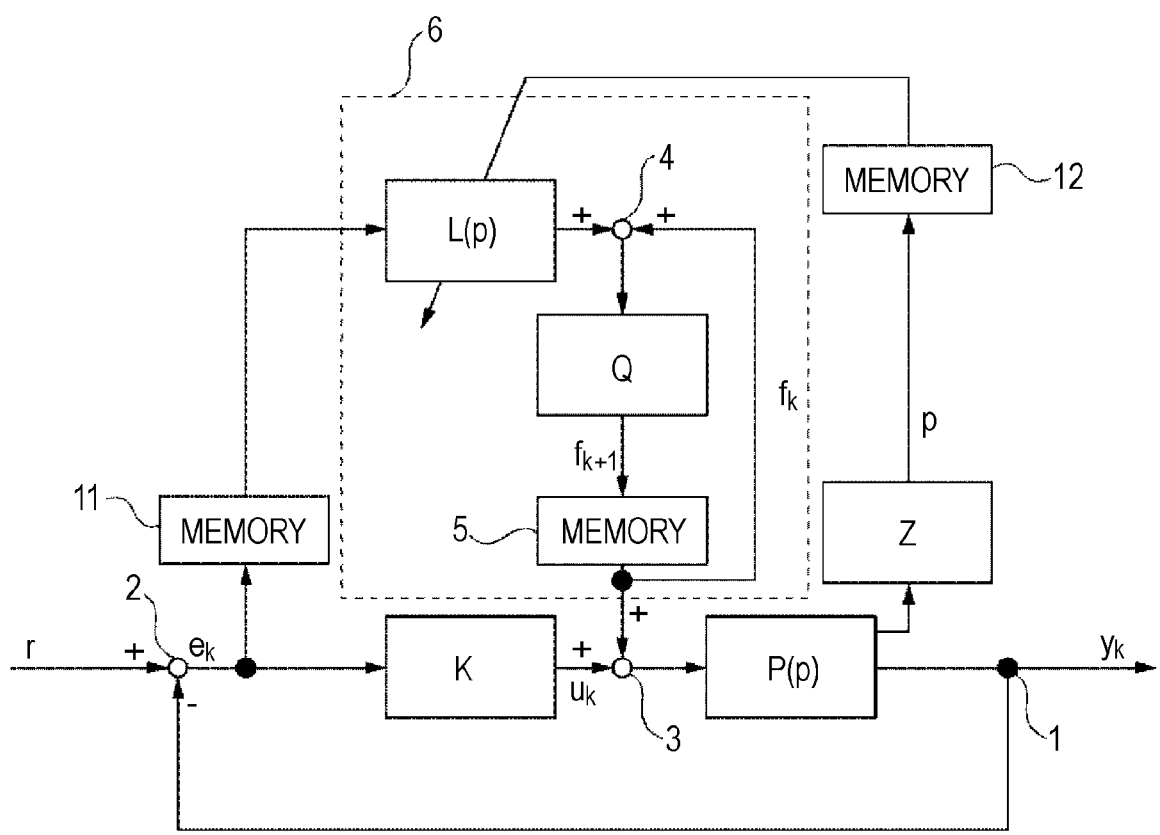
FIG. 9 is a control block diagram of a position control circuit when a zero-phase lowpass filter is used for a robustness filter in LPV iterative learning control.
Figure 10:
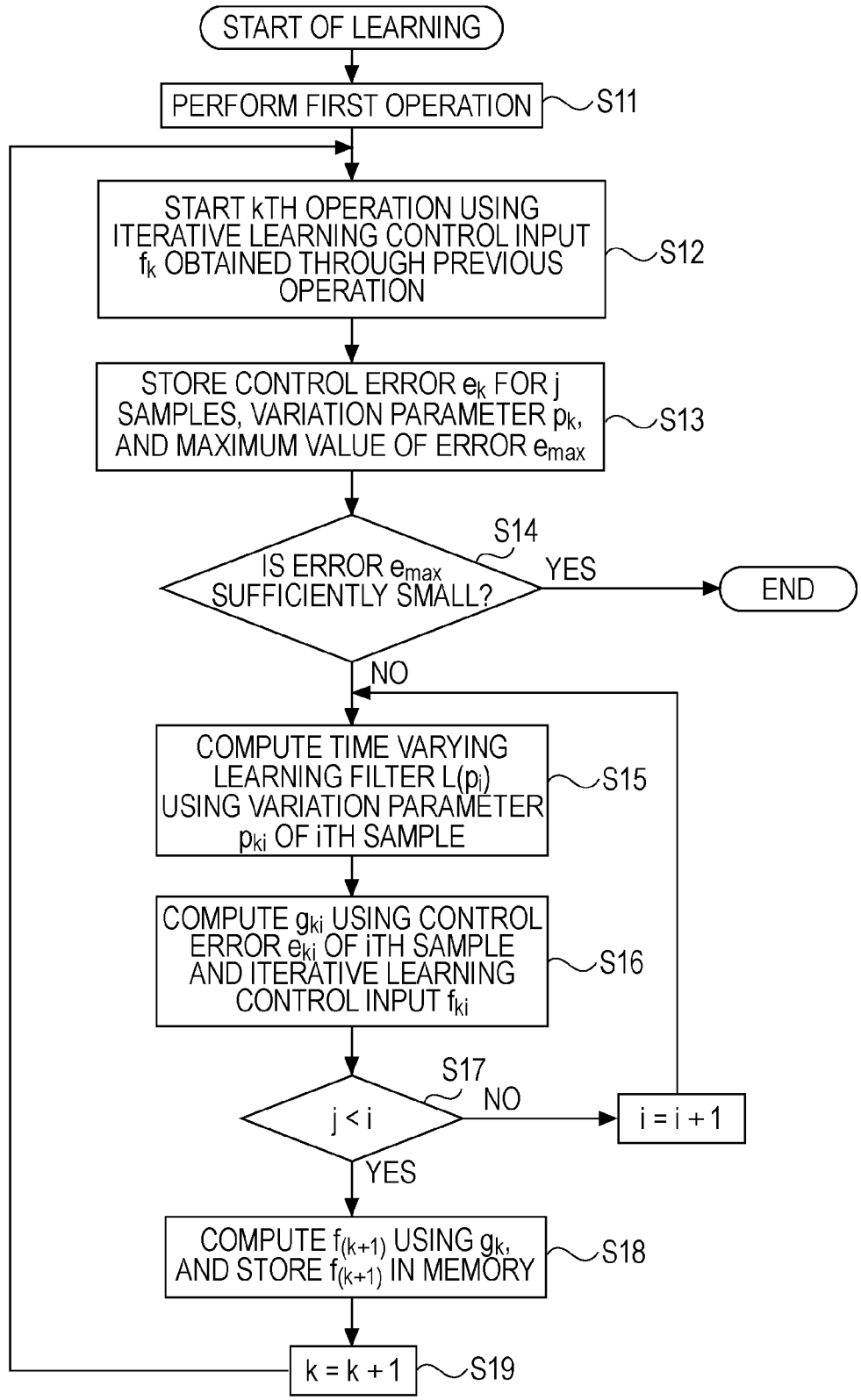
FIG. 10 is a flowchart of position control performed when a zero-phase lowpass filter is used for a robustness filter in LPV iterative learning control.

In addition, according to the present embodiment, a zero-phase lowpass filter is used for the robustness filter Q. Since a zero-phase lowpass filter cannot perform a real-time operation, the deviation $e_k$ and the parameter p are also stored in a memory, as shown in FIG. 9. A learning operation is performed each time a trial is completed. A particular processing flow is described below with reference to the flowchart shown in FIG. 10.

In step S11, a first trial is carried out. In step S11, control is performed without using the input from the iterative learning control circuit. A deviation $e_1$ is stored in a memory 11. In addition, the parameter $p_1$ is computed by the parameter variation computing unit Z and is stored in a memory 12. The deviation $e_1$ is input to the learning filter L(p). The output from the learning filter L(p) passes through the robustness filter Q and is stored in the memory 5 as an input $f_2$.

In step S12, a k-th trial (k>1) is carried out. At that time, the control input $f_k$ previously stored in the memory 5 is added to an output $U_k$ output from the controller. In this way, in the k-th trial, the control target is controlled. In addition, in the k-th trial, a control input $f_{k+1}$ used for the (k+1)th trial (k>1) is generated off-line through the following steps S15 to S18. Note that, since digital control is carried out, a control input and a deviation in an i-th sample in the k-th trial are denoted as $f_{ki}$ and $e_{ki}$ respectively. Let j denote the total number of samples in one trial. Initially, a maximum value $e_{max}$ of the deviation is set to 0, and a sample number i is set to 0.

In step S13, the deviation $e_k$ is stored in the memory 11. In addition, a parameter $p_k$ is computed by the parameter variation computing unit Z and is stored in the memory 12. Furthermore, a maximum value $e_{max}$ of the deviation $e_k$ is detected.

In step S14, the maximum value $e_{max}$ of the deviation is compared with a predetermined setting value. If the maximum value $e_{max}$ is smaller than or equal to the predetermined setting value (YES in step S14), it is determined that the deviation is sufficiently small. Therefore, the learning operation is completed. However, if the maximum value $e_{max}$ of the deviation is greater than the predetermined setting value (NO in step S14), then k is incremented by 1 (which conveniently may be written k=k+1). Thereafter, the processing proceeds to step S15.

In step S15, a parameter $P_{ki}$ of the i-th sample is read from the memory 12. Subsequently, a learning filter $L_i(P_i)$ is computed using the readout result. More specifically, the learning filter is computed using equation (10).

In step S16, a deviation $e_{ki}$ of the i-th sample is read from the memory. Subsequently, the deviation $e_{ki}$ is input to the learning filter $L_i(P_i)$. The output of the learning filter $L_i(P_i)$ is added to the control input $f_{ki}$. In this way, an output $g_{ki}$ is computed.

If, in step S17, j<i (YES in step S17), then the processing proceeds to step S18. However, if j≥i (NO in step S17), i=i+1. Subsequently, the processing proceeds to step S15.

In step S18, the output $g_k$ passes through the robustness filter Q, which is a zero-phase lowpass filter, and is stored in the memory as a control input $f_{(k+1)}$.

In step S19, k=k+1 and, subsequently, the processing proceeds to step S12, where the next trial is started. By repeating the above-described steps, the learning control is carried out.

The result of simulation according to the present embodiment is described below.

Figure 8:
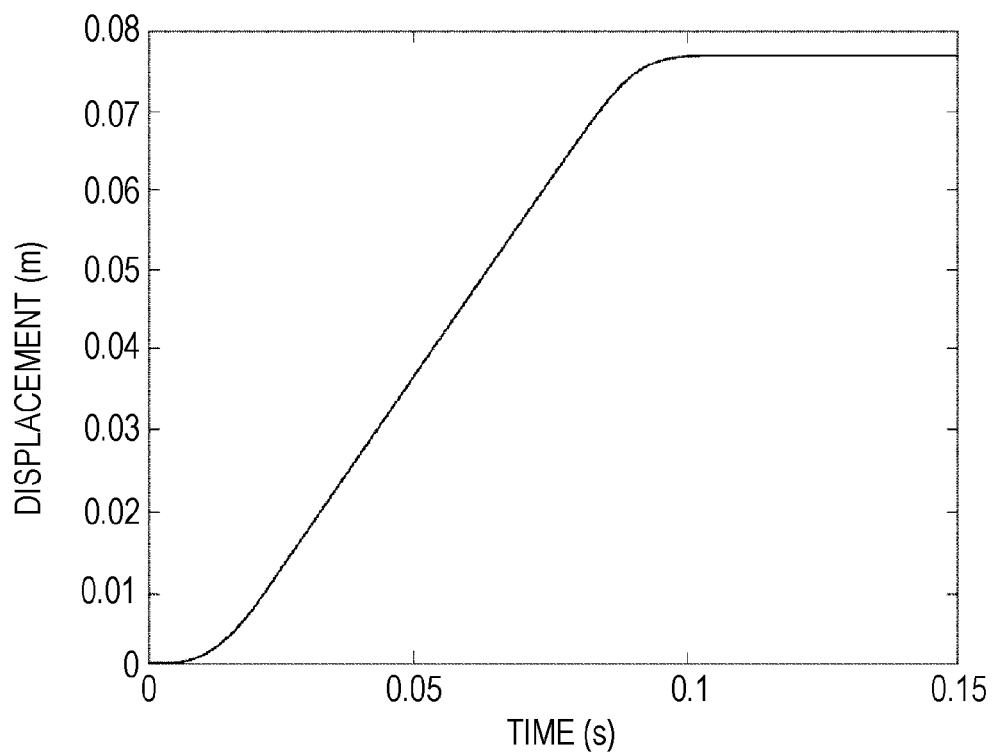
FIG. 8 illustrates a target trajectory of a control target.

In this simulation, a control target is controlled so as to track the target trajectory (the position profile) shown in FIG. 8. Note that, in addition to the control input obtained through the above-described iterative learning and the feedback input, a feedforward input obtained by multiplying the acceleration acquired from the position profile by a constant value is provided to the simulation.

Figure 11:
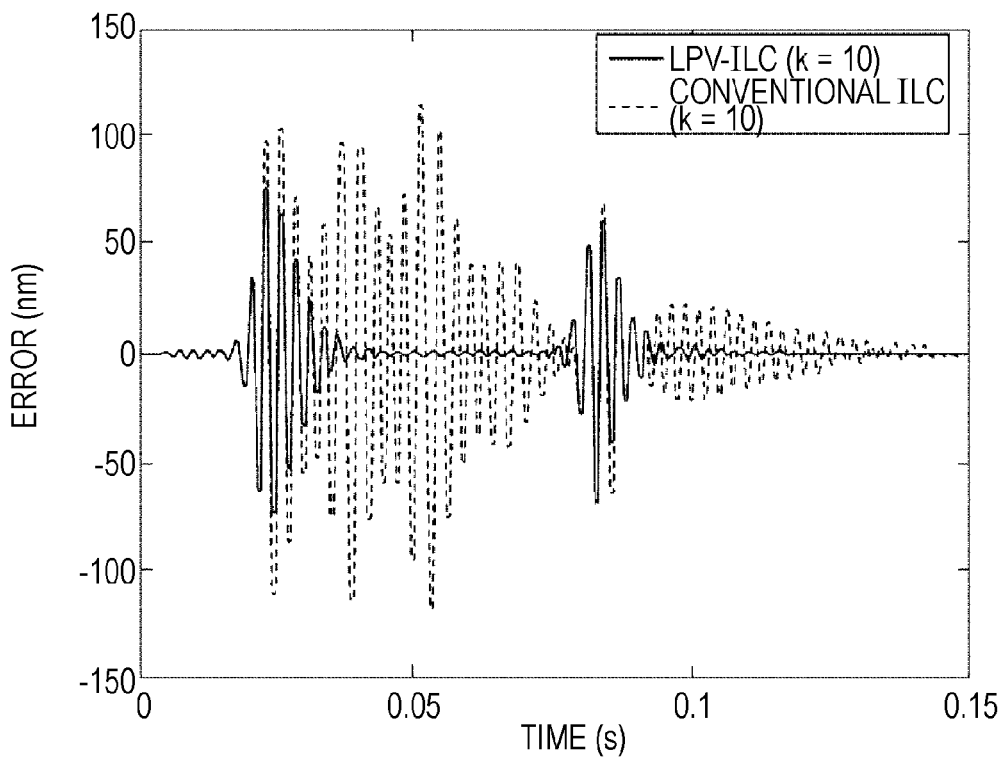
FIG. 11 illustrates a simulation result according to a first embodiment of the present invention.

FIG. 11 illustrates the deviation after ten trials have been carried out. In FIG. 11, a solid line represents the iterative learning control using an LPV learning filter. A dotted line represents the iterative learning control using a learning filter with a fixed parameter (hereinafter referred to as "LTI iterative learning control"). As can be seen from FIG. 11, the LPV iterative learning control can reduce the deviation, as compared with the LTI iterative learning control. This is because the LPV iterative learning control can be adaptive to the variation in the force by obtaining the value of the force coefficient a at a displacement x from the relationship shown in FIG. 5, obtaining the parameter p using equation (14), and changing the LPV learning filter.

Figure 12:
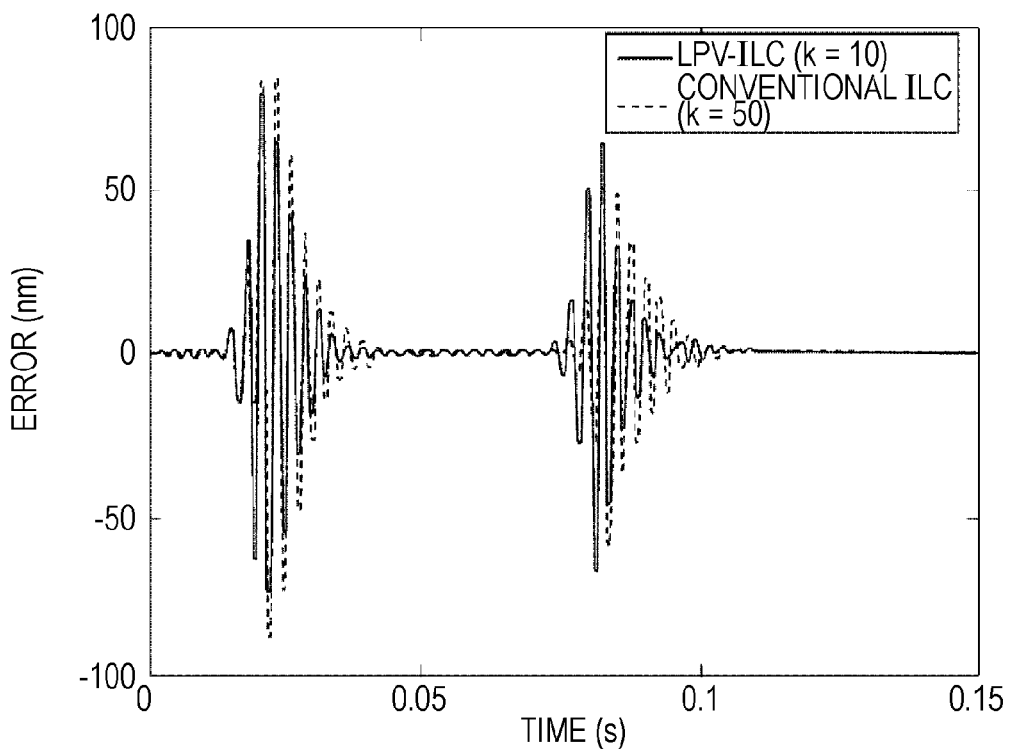
FIG. 12 illustrates a simulation result according to the first embodiment of the present invention.

FIG. 12 illustrates a comparison of the deviation obtained after 40 trials have been carried out using the LTI iterative learning control and the deviation obtained after 10 trials have been carried out using the LPV iterative learning control. The deviation obtained through the LTI iterative learning control is represented by a solid line, while the deviation obtained through the LPV iterative learning control is represented by a dotted line. As can be seen from FIG. 12, by using the LPV iterative learning control, a deviation can be reduced through the repetition number about one fifth of that of the LTI iterative learning control.

In addition, in order to compensate for the variation in the force, the control input may be corrected using preacquired force ripple data as follows:

$$u_u \rightarrow \frac{1}{a} u_u \quad (26)$$

However, in this technique, a feedback control system is directly corrected. Accordingly, if the preacquired force ripple data is different from the actual data, the robustness may be degraded. In contrast, in the LPV iterative learning control, a feedforward input is generated through iterative trials. Accordingly, the robustness of the closed-loop system is not degraded.

Figure 13:
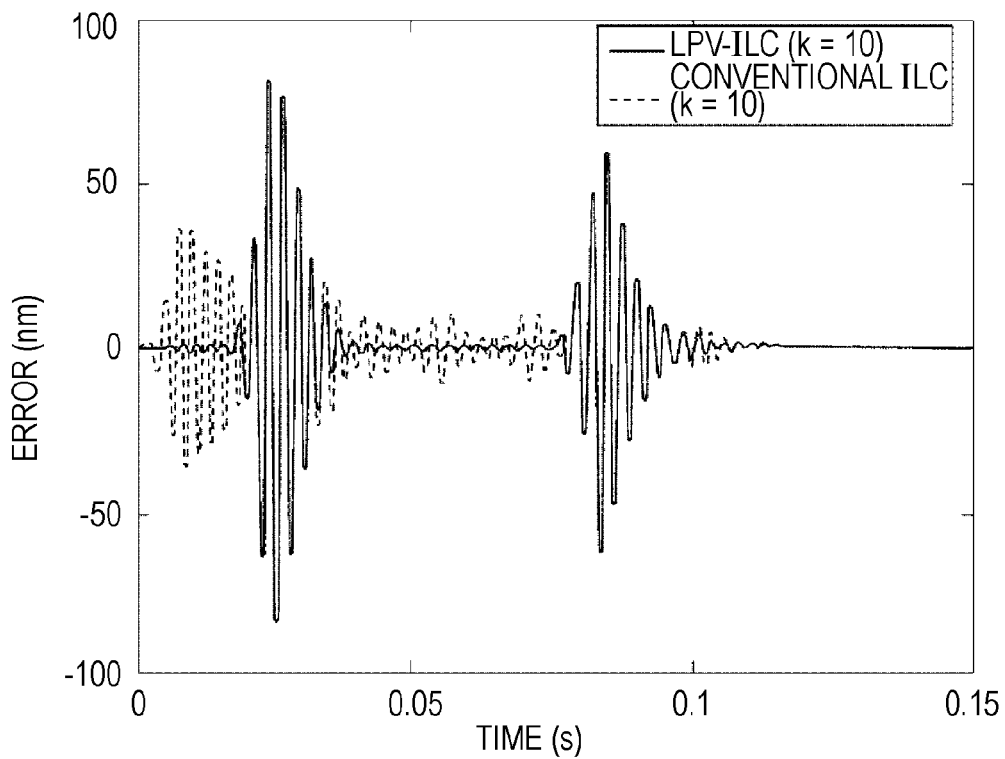
FIG. 13 illustrates a simulation result according to the first embodiment of the present invention.

FIG. 13 illustrates a simulation result when the actual variation in the force is shifted from the preacquired force ripple data by 3 mm. The deviation obtained after 10 trials have been carried out using the LPV iterative learning control is represented by a solid line, while the deviation obtained through the above-described direct compensation of the force coefficient and LTI iterative learning control is represented by a dotted line. The deviation obtained through the LTI iterative learning control is large because of the performance degradation of the feedback control system. However, the deviation through the LPV iterative learning control is negligibly degraded, as compared with the response shown in FIG. 11. Thus, it can be ensured that the LPV iterative learning control is robust.

In the second embodiment, the parameters include the disturbance force applied to a control target. Since the disturbance force is not an original parameter of the model, the disturbance force is considered as an equivalent dumping force of the system.

A position control apparatus according to the present embodiment is described next with reference to FIG. 1. Note that descriptions already made with reference to FIG. 1 are not repeated. The parameter variation computing unit Z includes a disturbance observer. The disturbance observer estimates a disturbance force using a control input and a displacement. By using the estimated disturbance force, the parameter variation computing unit Z can compute a variation in a parameter.

A method for deriving an LPV model when the parameter p includes a disturbance force is described next.

Let m denote the mass of the control target, x denote a displacement, $u_u$ denote a force input to the control target, and g denote a disturbance force. Then, the control target is modeled as follows:

$$m\ddot{x} = u_u + g \quad (27)$$

Here, by applying the following extended linearization:

$$g = \frac{g}{\dot{x}} \cdot \dot{x}, \quad (28)$$

the state equation of equation (27) can be obtained as follows:

$$\dot{x} = \begin{bmatrix} 0 & 1 \\ 0 & \frac{g}{(m\dot{x})} \end{bmatrix} x + \begin{bmatrix} 0 \\ \frac{1}{m} \end{bmatrix} u_u \quad (29)$$

Thus, a disturbance force can be introduced into a system matrix.

By setting:

$$p = \frac{g}{m\dot{x}} \quad (30)$$

(however, when $\dot{x}=0$) (31), $$p = 0 \quad (32))\text{ and}$$

forming the augmented plant of the amplifying characteristics of an actuator, the following affine parameter-dependent model that varies in accordance with the disturbance force can be obtained, as in the first embodiment:

$$\dot{x}_w = A_w(p)x_w + B_w u \quad (33)$$

Then, by using a generalized plant similar to that of the first embodiment, an LPV learning filter can be derived. The changing range of the parameter p is set to:

$$P_{min} = -20 \leq p \leq 20 = p_{max}. \quad (34)$$

If the parameter p exceeds the upper limit $p_{max}$ and the lower limit $P_{min}$, then the upper limit $p_{max}$ and the lower limit $P_{min}$ are used for the parameter p respectively.

The simulation result of the present embodiment is described below.

Figure 14:
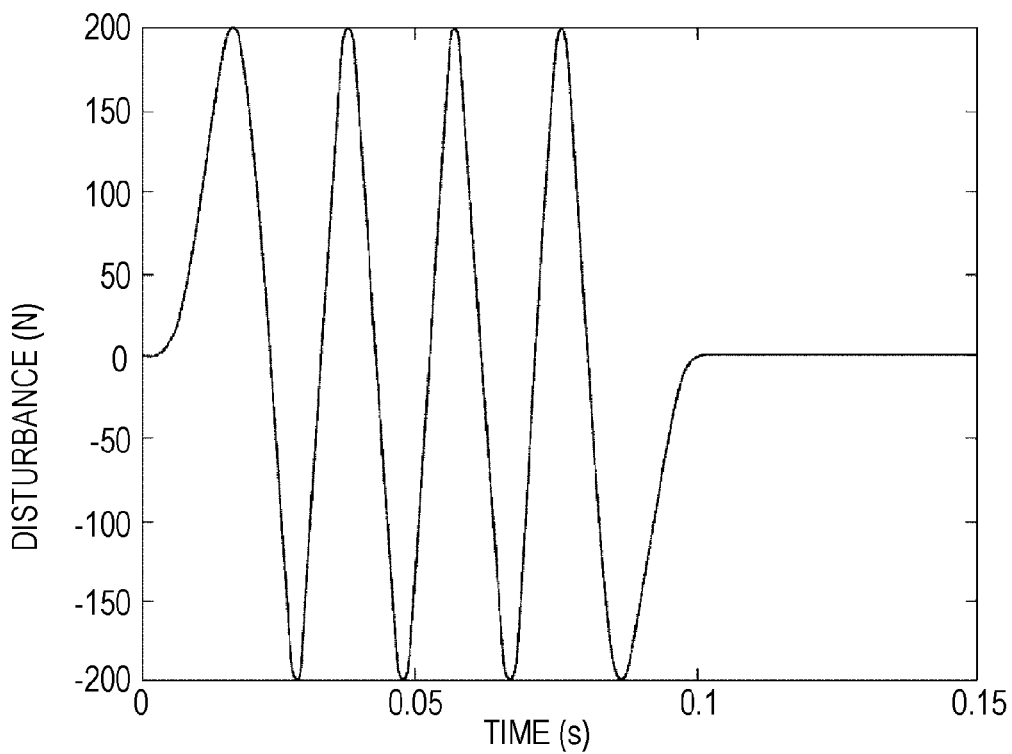
FIG. 14 illustrates a disturbance force applied to a control target.

FIG. 14 illustrates the disturbance applied to a control target. The disturbance is a parameter of the simulation. The disturbance force is estimated by the disturbance observer. Thereafter, the parameter p is computed using the estimated disturbance force, the speed, and equation (30). Subsequently, the LPV learning filter is computed in accordance with the parameter p.

Since the detailed learning flow is the same as that of the first embodiment, descriptions thereof are not repeated.

Note that, in the simulation using the disturbance shown in FIG. 14 and the profile shown in FIG. 8, the parameter p does not exceed the upper and lower limits.

Figure 15:
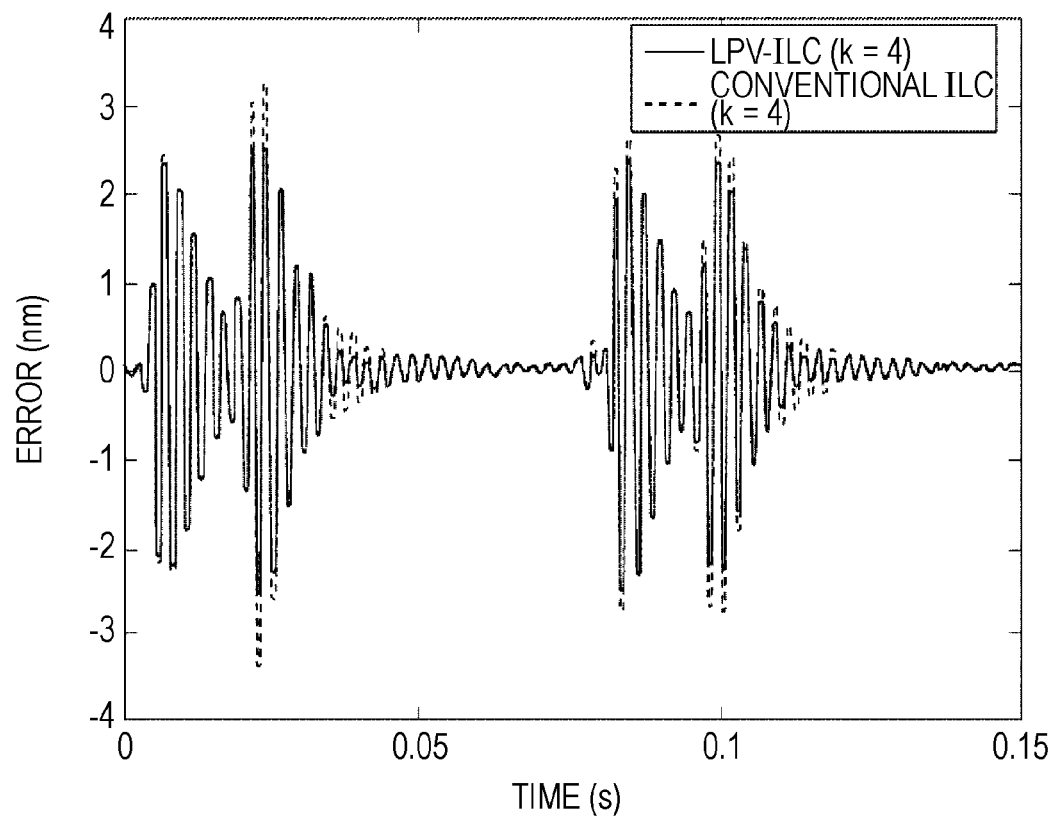
FIG. 15 illustrates a simulation result according to a second embodiment of the present invention.

FIG. 15 illustrates the deviation after four trials have been carried out. The iterative learning control using an LPV learning filter is represented by a solid line, and the LTI iterative learning control is represented by a dotted line. As can be seen from FIG. 15, in the LPV iterative learning control, a high tracking performance is obtained in the range from 0.03 sec to 0.05 sec. In contrast, in the LTI iterative learning control, when two more trials have been carried out, a performance the same as that of the LPV iterative learning control is obtained. As described above, since the LPV iterative learning control estimates the disturbance force and varies the learning filter so as to be adaptive to the disturbance force, the LPV iterative learning control can obtain a high quality learning result. Accordingly, the LPV iterative learning control can reduce the number of iterations.

In the third embodiment, the parameters including a variation in the attitude angle of a control target is described with reference to FIG. 1. Note that descriptions already made with reference to FIG. 1 are not repeated.

The parameter variation computing unit Z includes a sensor (an attitude detecting unit) for detecting the attitude angle of a control target.

Figure 16:
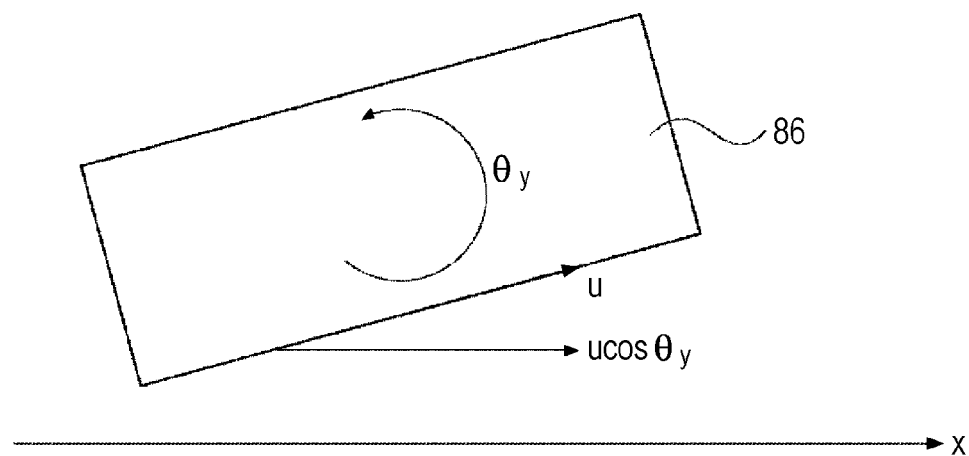
FIG. 16 illustrates the coordinates of a control target according to a third embodiment of the present invention.

A method for deriving an LPV model when the parameter p includes the attitude angle of a control target is described next. FIG. 16 illustrates the movement of a movable body 86, which is a control target, when the movable body 86 receives a control input $u_u$. In FIG. 16, the abscissa represents the x-axis, and the axis perpendicular to the plane of FIG. 16 represents the y-axis. In addition, $\theta_y$ denotes a rotation angle of the movable body 86 about the y-axis.

As shown in FIG. 16, when a thrust force is generated in a direction parallel to a bottom surface of the control target, the thrust force in the x-axis direction is a component force of the control input $u_u$ in a direction parallel to the x-axis direction. Accordingly, the thrust force in the x-axis direction can be given by $u_u \cos \theta_y$.

The state equation of the control target is expressed as follows:

$$\dot{x} = \begin{bmatrix} 0 & 1 \\ 0 & 0 \end{bmatrix} x + \begin{bmatrix} 0 \\ \frac{\cos\theta_y}{m} \end{bmatrix} u_u \quad (35)$$

When setting:

$$p = \frac{\cos\theta_y}{m}, \quad (36)$$

and obtaining the augmented plant of the state equation with the amplifying characteristics of an actuator, as in the first embodiment, then the following affine parameter-dependent model that varies in accordance with the rotation angle can be obtained:

$$\dot{x}_w = A_w(p)x_w + B_w u \quad (37)$$

Subsequently, as in the first embodiment, an LPV learning filter is derived using a generalized plant. At that time, the variation range of the parameter p is defined as follows:

$$\frac{\cos(41\pi/180)}{m} \leq p \leq \frac{\cos 0}{m} \quad (38)$$

The simulation result of the present embodiment is described below.

Figure 17:
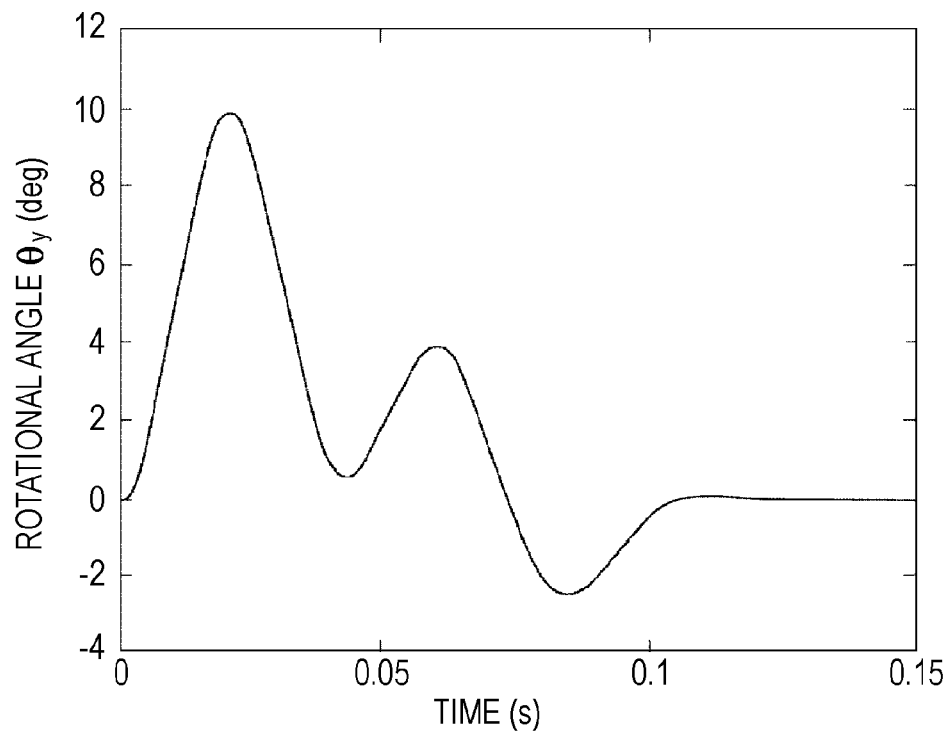
FIG. 17 illustrates the movement and rotation of a control target according to an embodiment of the present invention.

In the present embodiment, the rotation angle $\theta_y$ is controlled by another control system shown in FIG. 17 where is different from a control system that controls the movement in the x-axis direction. In addition, the rotation angle $\theta_y$ is directly measured by a sensor. Accordingly, a variation in the parameter can be computed using information from the sensor and equation (38). Thereafter, the LPV filter can be varied.

The detailed learning flow is the same as that of the first embodiment.

Figure 18:
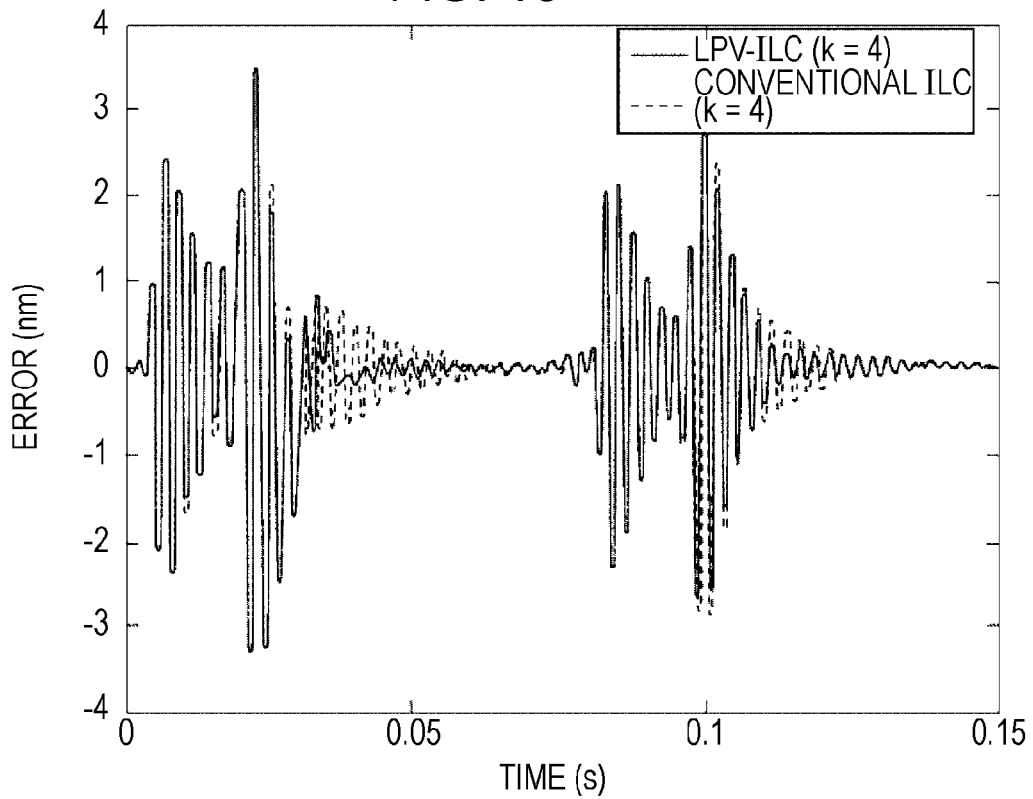
FIG. 18 illustrates a simulation result according to the third embodiment of the present invention.

FIG. 18 illustrates the deviation after four trials have been carried out. The iterative learning control using an LPV learning filter is represented by a solid line, and the LTI iterative learning control is represented by a dotted line. As can be seen from FIG. 18, in the LPV iterative learning control, a small deviation is obtained in the range from 0.03 sec to 0.07 sec. In contrast, in the LTI iterative learning control, when three more trials have been carried out, a performance the same as that of the LPV iterative learning control is obtained. As described above, since the LPV iterative learning control computes a variation in the parameter using the measured value output from the sensor and varies the learning filter in accordance with the computation result, the LPV iterative learning control can obtain a high quality learning result. Accordingly, the LPV iterative learning control can reduce the number of iterations.

Figure 19:
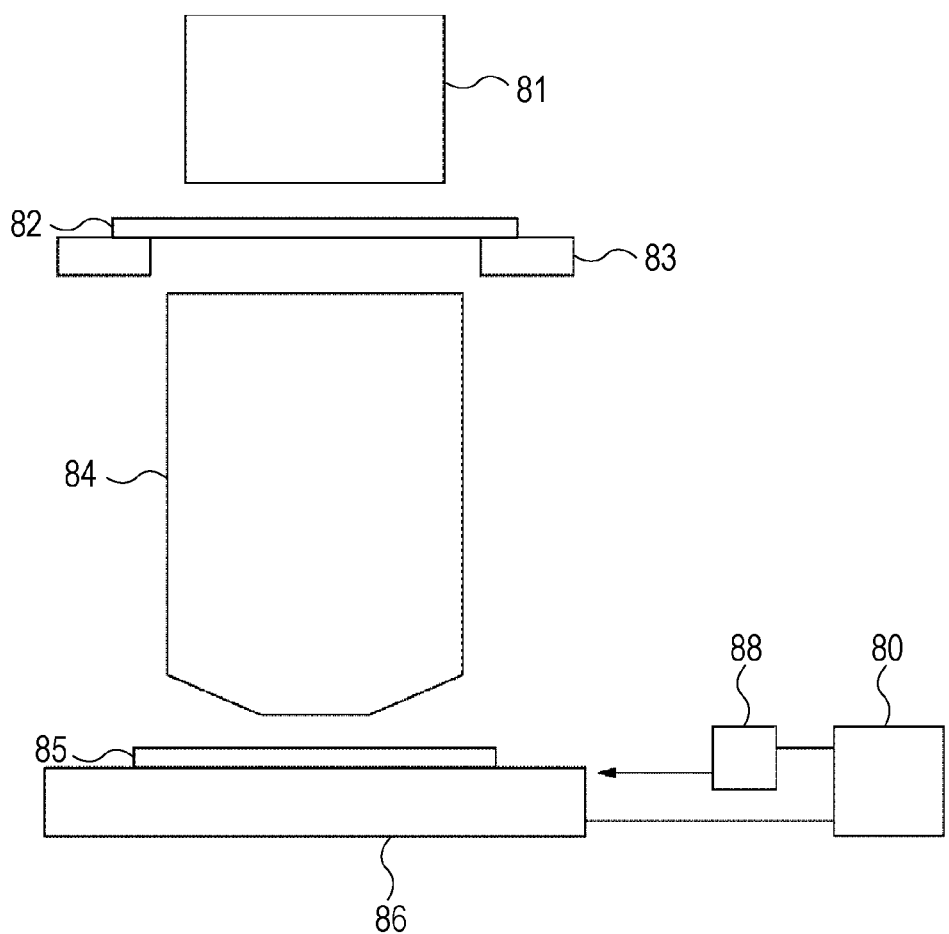
FIG. 19 is a schematic illustration of an exposure apparatus to which an iterative learning control apparatus is applied.

FIG. 19 is a schematic illustration of an example of an exposure apparatus to which one of the position control apparatuses according to the embodiments of the present invention is applied. According to the present embodiment, the exposure apparatus is only illustrative. Therefore, the configuration of the exposure apparatus is not limited to the configuration described below.

An exposure apparatus 100 includes an illumination optical system 81, a movable reticle stage 83 having a reticle 82 mounted thereon, a projection optical system 84, and a movable wafer stage 86 having a wafer 85 mounted thereon. The exposure apparatus 100 further includes a sensor 88 that detects the position of the wafer stage 86.

Light is emitted from the illumination optical system 81 onto the wafer (substrate) 85 via the reticle (original) 82 and the projection optical system 84. In this way, a reduced pattern of the reticle 82 is projected onto a wafer by the projection optical system 84. Thus, the image of the reduced pattern is formed on the wafer.

The exposure apparatus 100 further includes a control board 80 disposed in a control box. The control board 80 includes the position control apparatus 7 according to one of the above-described embodiments. An existing DSP system can be used for the control board 80. The control board 80 is connected to the sensor 88, a main central processing unit (CPU) (not shown) of the exposure apparatus 100, and a driver (not shown) that drives the stage so as to be communicable with these components.

Through such a configuration, the exposure apparatus 100 detects or estimates a variation in a parameter on the basis of a position signal output from, for example, the sensor 88. Thereafter, the exposure apparatus 100 carries out the iterative learning control while taking into account a variation in the parameter so as to control the position of the wafer stage 86.

Before the exposure apparatus 100 starts an actual exposure operation, the exposure apparatus 100 can drive the wafer stage 86 k times. In this way, the exposure apparatus 100 can start the actual exposure operation after the maximum value $e_{max}$ of the deviation becomes sufficiently small. After the maximum value $e_{max}$ of the deviation becomes sufficiently small, the exposure apparatus 100 may or may not update a control input $f_k$.

Alternatively, in place of controlling the wafer stage 86, the position control apparatus according to one of the above-described embodiments may be used for controlling the reticle stage 83.

In addition, a device (e.g., a semiconductor integrated circuit device or a liquid crystal display device) can be manufactured using the above-described exposure apparatus. Here, a method for manufacturing the device includes a step of performing an exposure operation on a wafer (a substrate) having a photosensitive agent applied thereon using the exposure apparatus 100. Conventional processing steps, such as developing the substrate, may then be applied to complete the manufacturing of the device.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-050126 filed Feb. 29, 2008, which is hereby incorporated by reference herein in its entirety.

What is claimed is:

1. A position control apparatus comprising:
a detecting unit configured to detect a position of a control target;
a subtracting unit configured to subtract an output of the detecting unit from a target value;
an iterative learning control circuit including a time variant filter into which a deviation between the output of the detecting unit and the target value is input and a linear time invariant filter configured to block a predetermined frequency range, the iterative learning control circuit feeding forward a control input to the control target; and
a parameter computing unit configured to compute a variation in a parameter of the control target;
wherein a characteristic of the time variant filter is changed in accordance with the variation in the parameter of the control target, and wherein the time variant filter includes two invariant filters having invariant characteristics and an interpolation computing unit that interpolates values between the two invariant filters.

2. The position control apparatus according to claim 1, wherein the time variant filter is derived from a linear parameter varying model.

3. The position control apparatus according to claim 1, wherein the parameter includes a force coefficient of a drive unit that drives the control target, and wherein the parameter computing unit computes a variation in the force coefficient based on the output from the detecting unit using a prestored relationship between a position of the control target and the force coefficient.

4. The position control apparatus according to claim 1, further comprising:
a disturbance observer;
wherein the variation in the parameter is computed based on an output of the disturbance observer.

5. The position control apparatus according to claim 1, further comprising:
an attitude detecting unit;
wherein the parameter includes an attitude of the control target, and the attitude detecting unit detects the attitude of the control target.

6. An exposure apparatus configured to project a pattern of an original onto a substrate and expose the substrate to light, comprising:
a stage having one of the original and the substrate mounted thereon, the stage positioning the one of the original and the substrate, the stage including a position control apparatus, the position control apparatus including a detecting unit configured to detect a position of a control target, a subtracting unit configured to subtract an output of the detecting unit from a target value, an iterative learning control circuit including a time variant filter into which a deviation between the output of the detecting unit and the target value is input and a linear time invariant filter configured to block a predetermined frequency range, wherein the iterative learning control circuit feeds forward a control input to the control target, and a parameter computing unit configured to compute a variation in a parameter of the control target;
wherein a characteristic of the time variant filter is changed in accordance with the variation in the parameter of the control target, and wherein the time variant filter includes two invariant filters having invariant characteristics and an interpolation computing unit that interpolates values between the two invariant filters.

7. A method for manufacturing a device, comprising:
exposing a substrate to light through a pattern of an original using an exposure apparatus; and
developing the exposed substrate;
wherein the exposure apparatus includes a stage having one of the original and the substrate mounted thereon, the stage positioning the one of the original and the substrate, and wherein the stage includes a position control apparatus, and wherein the position control apparatus includes a detecting unit configured to detect a position of a control target, a subtracting unit configured to subtract an output of the detecting unit from a target value, an iterative learning control circuit including a time variant filter into which a deviation between the output of the detecting unit and the target value is input and a linear time invariant filter configured to block a predetermined frequency range, wherein the iterative learning control circuit feeds forward a control input to the control target, and a parameter computing unit configured to compute a variation in a parameter of the control target, wherein a characteristic of the time variant filter is changed in accordance with the variation in the parameter of the control target, and wherein the time variant filter includes two invariant filters having invariant characteristics and an interpolation computing unit that interpolates values between the two invariant filters.

8. A position control apparatus comprising:
a detecting unit configured to detect a position of a control target;
a deviation computing unit configured to compute a deviation between an output of the detecting unit and a target value;
a feedback controller configured to generate a feedback signal to be input to the control target using the deviation;
an iterative learning control circuit configured to generate a feedforward signal to be input to the control target, the iterative learning control circuit including a time variant filter that generates a control signal using the deviation obtained in a kth trial (k≥1) and a linear time invariant filter configured to block a predetermined frequency range of a signal obtained by summing the control signal generated by the time variant filter using the deviation computed in a kth trial (k≥1) and the feedforward signal generated for the kth trial, the iterative learning control circuit generating the feedforward signal for a (k+1)th trial using the control signal generated by the time variant filter using the deviation computed in the kth trial and the feedforward signal generated for the kth trial;
a parameter computing unit configured to compute a variation in a parameter of the control target;
a changing unit configured to change a characteristic of the time variant filter in accordance with the variation in the parameter of the control target;
an adding unit configured to sum the feedback signal generated in the (k+1)th trial and the feedforward signal generated for the (k+1)th trial; and
wherein the time variant filter includes two invariant filters having invariant characteristics and an interpolation computing unit that interpolates values between the two invariant filters.

9. A position control apparatus comprising:
a detecting unit configured to detect a position of a control target;
a filter configured to generate a control input using a deviation between an output of the detecting unit and a target value;
an iterative learning control circuit configured to feed forward the control input to the control target and including a learning filter and a linear time invariant filter for blocking a predetermined frequency range;
a parameter computing unit configured to compute a variation in a parameter of the control target;
a changing unit configured to change a characteristic of the learning filter in accordance with the variation in the parameter of the control target; and
wherein the learning filter includes two invariant filters having invariant characteristics and an interpolation computing unit that interpolates values between the two invariant filters.

10. An iterative learning method for use in a position control apparatus having an iterative learning control circuit including a learning filter, the method comprising:
applying an iterative learning input obtained in a kth trial to a control target;
computing the learning filter by acquiring a variation parameter of the control target; and computing the iterative learning input for a (k+1)th trial using a control input generated by the learning filter using a deviation between a position of the control target in a kth trial and a target value and an iterative learning input computed for the kth trial and a linear time invariant filter for blocking a predetermined frequency range; and wherein the learning filter includes two invariant filters having invariant characteristics and an interpolation computing unit that interpolates values between the two invariant filters.

* * * * *